United States Patent
Cygan et al.

[11] Patent Number: 5,574,992
[45] Date of Patent: Nov. 12, 1996

[54] METHOD AND APPARATUS FOR REDUCING OFF-CHANNEL INTERFERENCE PRODUCED BY A LINEAR TRANSMITTER

[75] Inventors: Lawrence F. Cygan, Schaumburg; Paul H. Gailus, Prospect Heights; William J. Turney, Schaumburg; Michael H. Baker, Elmhurst, all of Ill.

[73] Assignee: Motorola, Inc., Schaumburg, Ill.

[21] Appl. No.: 235,415

[22] Filed: Apr. 29, 1994

[51] Int. Cl.[6] .................................................. H04B 1/04
[52] U.S. Cl. ...................... 455/126; 455/115; 455/116; 455/127; 330/129; 330/149
[58] Field of Search ........................... 455/126, 127, 455/63, 115, 67.1, 67.3, 50.1, 93, 116; 330/107, 129, 149, 109, 75

[56] References Cited

U.S. PATENT DOCUMENTS

| | | | |
|---|---|---|---|
| 3,737,782 | 6/1973 | Pierce | 455/115 |
| 5,041,793 | 8/1991 | Gailus | 330/2 |
| 5,060,294 | 10/1991 | Schwent et al. | 455/93 |
| 5,066,923 | 11/1991 | Gailus et al. | 330/107 |
| 5,119,040 | 6/1992 | Long et al. | 330/149 |
| 5,134,718 | 7/1992 | Gailus | 455/102 |
| 5,239,693 | 8/1993 | Gailus et al. | 455/115 |
| 5,287,555 | 2/1994 | Wilson et al. | 455/115 |
| 5,371,481 | 12/1994 | Tiitanen et al. | 332/103 |
| 5,423,082 | 6/1995 | Cygan et al. | 455/126 |

FOREIGN PATENT DOCUMENTS 2213006  8/1989  United Kingdom .................. 455/126

Primary Examiner—Reinhard J. Eisenzopf
Assistant Examiner—Lee Nguyen
Attorney, Agent, or Firm—James A. Coffing; Daniel C. Crilly

[57] ABSTRACT

A linear transmitter (100), which utilizes closed loop feedback to maintain its linearity, employs a method for reducing off-channel interference produced by the linear transmitter (100). A dynamically alterable parameter source (DAPS, 126) is provided to the linear transmitter (100). The DAPS (126) is then used to adjust at least one loop parameter of the closed loop feedback such that off-channel interference is reduced.

8 Claims, 4 Drawing Sheets

5,574,992

METHOD AND APPARATUS FOR REDUCING OFF-CHANNEL INTERFERENCE PRODUCED BY A LINEAR TRANSMITTER

FIELD OF THE INVENTION

The present invention relates generally to linear transmitters and, in particular, to a method of reducing off-channel interference produced by a linear transmitter.

BACKGROUND OF THE INVENTION

Linear transmitters are known. A negative feedback (e.g., a Cartesian feedback) transmitter constitutes one such known transmitter. When properly adjusted, a negative feedback transmitter satisfactorily operates in a linear mode. That is, negative feedback linear transmitters require frequent feedback loop adjustments to maintain their linear performance. Such adjustments are typically made to the phase shift of, and to the level of the signal inputted to, the feedback loop incorporated within the linear transmitter. When these parameters are left unadjusted, changes in the operating or environmental conditions of the linear transmitter often result in undesired interference, or splatter, into frequencies substantially adjacent to the operating frequency of the linear transmitter. For example, a decrease in the supply voltage to the transmitter's amplifier stages, or operation of the transmitter at high ambient temperatures (e.g., 40 degrees Celsius), might result in decreased loop gain and undesired clipping of the transmitter's output signal, thereby producing adjacent channel splatter.

To insure proper adjustment of the feedback loop parameters, one prior art approach provides for training of the linear transmitter to periodically adjust the loop phase and gain. This approach is described in detail in U.S. Pat. No. 5,066,923, entitled "Linear Transmitter Training Method And Apparatus," and assigned to Motorola, Inc. Although this approach minimizes adjacent channel splatter produced by the linear transmitter during normal transmitter operation, under some conditions the training signal itself may produce undesired levels of adjacent channel splatter. For example, the splatter produced during training can cause off-channel interference in geographic areas of dense spectral utilization (i.e., closely adjacent frequencies) such as urban areas.

Therefore, a need exists for a method of reducing off-channel interference produced by the training of a linear transmitter.

DESCRIPTION OF A PREFERRED EMBODIMENT

Generally, the present invention encompasses a method for reducing off-channel interference produced by a linear transmitter that utilizes closed loop feedback to maintain its linearity. A dynamically alterable parameter source is provided to the linear transmitter. The dynamically alterable parameter source is used to adjust at least one loop parameter of the closed loop feedback path, such that off-channel interference is reduced. By using a dynamically alterable parameter source to adjust the loop parameters, the present invention obviates the need to train the linear amplifier as often as in the prior art, thereby effectively reducing training-generated interference.

Figure 1:
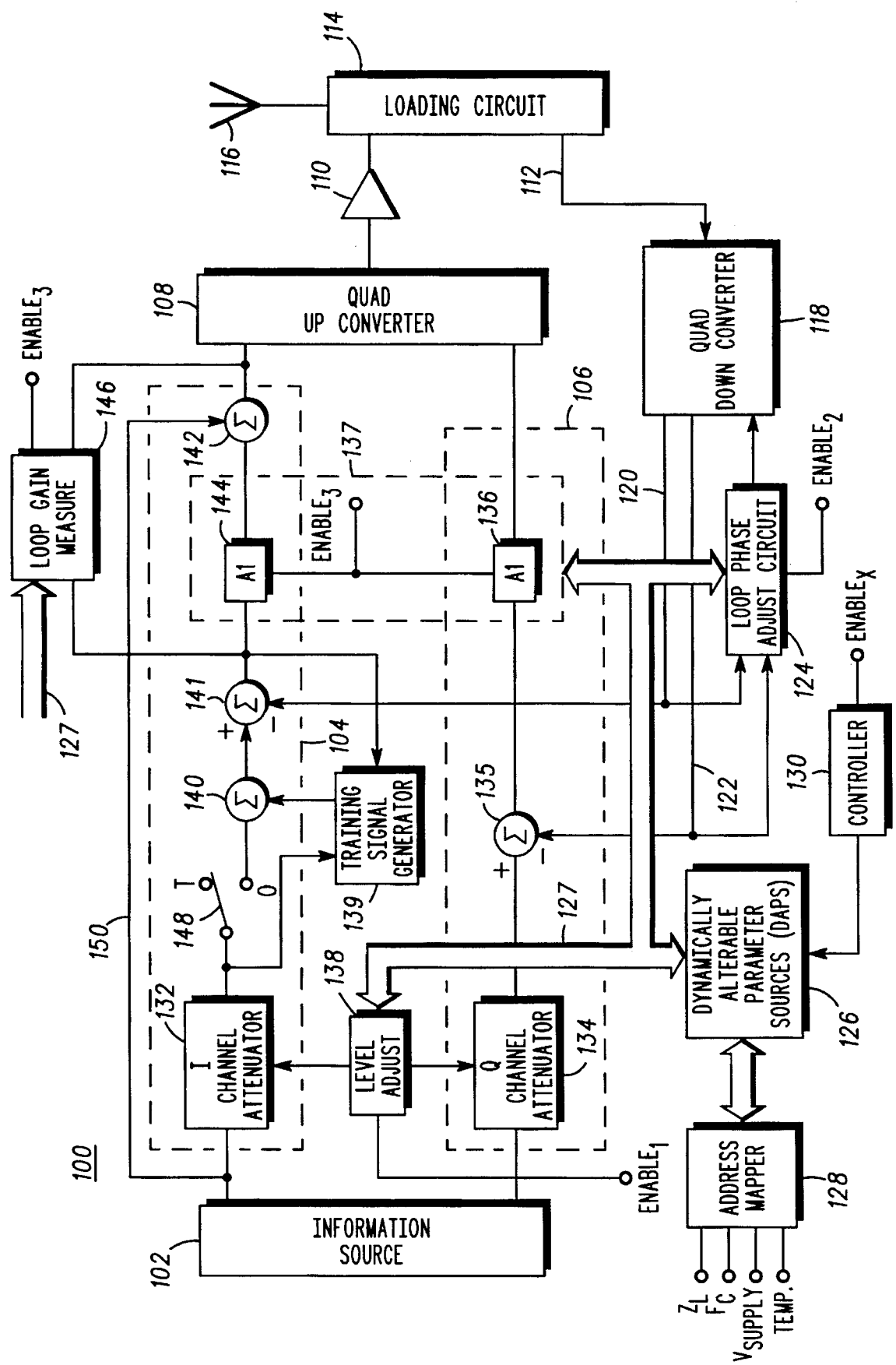
FIG. 1 illustrates a block diagram depiction of a linear transmitter in accordance with the present invention.

The present invention can be more fully described with reference to FIGS. 1–6. FIG. 1 illustrates a block diagram depiction of a linear transmitter 100 in accordance with the present invention. The linear transmitter 100 comprises an information source 102, an in-phase forward signal path 104, a quadrature forward signal path 106, which paths are combined using a quadrature up converter 108. The output of the quadrature up converter 108 is inputted to a power amplifier 110, whose output is sampled using a directional coupler 112 and provided to a loading circuit 114 that is coupled to an antenna 116. The sampled output of the power amplifier 110 is further provided to a quadrature down converter 118, which in turn produces an in-phase feedback component 120, and a quadrature feedback component 122, that are provided to a loop phase adjusting circuit 124. The linear transmitter 100 further includes a dynamically alterable parameter source (DAPS, 126), which is coupled to a general data bus 127 that is used throughout the transmitter circuit 100. An address mapper 128 is used to convert operating parameters (e.g., $F_c$, $V_s$, Temp, $Z_L$) to a memory location in the DAPS 126. That is, for each unique combination of operating parameters, the address mapper points to a particular location in memory that contains the appropriate adjustment value, for use as later described. A controller 130 controls the DAPS 126, and generates an enable signal for use by the various adjusting circuits (e.g., loop phase adjust circuit 124).

The in-phase (I) forward signal path 104 further includes an attenuator 132, conventional summing circuits 140–142, and a variable gain amplifier 144. Similarly, the quadrature (Q) forward signal path 106 includes an attenuator 134, a conventional summing circuit 135, and a variable gain amplifier 136. It should be noted that variable gain amplifiers 136, 144 together constitute a loop gain adjusting circuit 137. The linear transmitter circuit 100 further includes a signal level adjusting circuit 138 that is coupled to the DAPS 126 and has outputs to attenuators 132, 134. A training signal generator 139 produces a specialized training waveform during a training interval, as is recognized in the art, to provide a reference signal from which to make required modulation (i.e., signal level) measurements and adjustments. The present invention further utilizes the training waveform to provide a reference signal from which to make loop gain measurements and adjustments. A loop gain measurement circuit 146 is used to measure the gain for the variable segment of one of the forward signal paths.

Generally, a training procedure is enabled when the forward signal path is interrupted (i.e., switch 148 is put in the "T" position) and the forward signal follows a training signal path 150. During the training procedure, one or more predetermined training pulses, or waveforms, are imparted onto the forward signal path, so that phase adjustments made during this procedure are done under known signal conditions.

The above blocks will be generally understood by those skilled in the art. In addition, details regarding the forward signal path circuitry, as well as a preferred training signal waveform, can be found in U.S. Pat. No. 5,066,923. Details regarding the level adjusting circuit 138 can be found in U.S. Pat. No. 5,239,693. Further details regarding the variable gain amplifiers 136, 144 can be found in U.S. Pat. No. 5,041,793. Each of these documents is incorporated herein by reference.

The DAPS 126 is utilized to reduce training in the following manner: during training, the DAPS 126 stores adjustment values for one or more of the adjusting circuits, based on the operating conditions under which the training is performed. For each combination of operating parameter values (e.g., temperature and supply voltage), corresponding adjustment value(s) is identified that most closely approximates the value required to provide linear operation. Identification of these values can be done using a conventional look-up table or a system of equations, as later described. In this manner, a periodic training procedure (i.e., under specific operating conditions that change with time) provides adjustment information across a multitude of potential operating conditions. In the alternative off-line training procedure, operating conditions can be artificially changed (e.g., frequency sweep) during the off-line training procedure, as later described, to provide the adjustment information.

Figure 2:
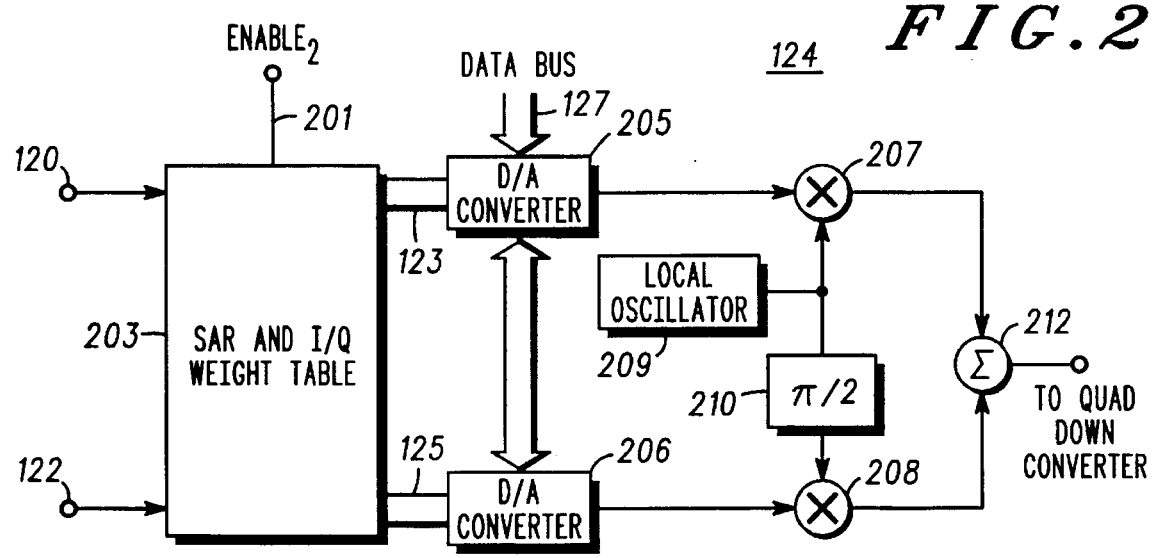
FIG. 2 illustrates a block diagram depiction of a loop phase adjust circuit in accordance with a preferred embodiment of the present invention.

FIG. 2 shows a more detailed block diagram of the loop phase adjusting circuit 124: When the circuit is enabled using control line 201, a successive approximation register (SAR) and I/Q weight table 203 process the down-converted signals 120, 122. The weight table 203 varies the weights 123, 125 applied to the respective D/A converters 205, 206, while monitoring signals 120, 122. The weights 123, 125 are iteratively adjusted to maximize signal 120 and minimize signal 122, or in the alternative, to maximize signal 122 and minimize signal 120. The weights 123, 125 direct each D/A converter 205, 206 to produce a voltage that acts to control the output levels of the corresponding mixer 207, 208. The output of mixer 207 is a scaled version of a local oscillator (LO) signal 209, while the output of mixer 208 is a scaled version of the LO signal 209 that has been shifted in phase by 90 degrees (i.e. after going through a phase shifter 210). The outputs of the mixers 207, 208 are then summed using a conventional summer 212, whose output is provided to the quadrature down-converter 118. By varying the weights applied to the mixers 207, 208 prior to summing, the weight table 203 effectively controls the phase of the LO signal 209 produced at the output of the summer 212. The phase of the LO signal 209 applied to the down-converter 118 controls the levels of signals 120, 122. This weighting procedure is known in the art, and further discussion is therefore unnecessary.

The weights 123, 125 applied to the D/A converters 205, 206 are readable from the data bus 127. In a preferred embodiment, the weights received by the D/A converters 205, 206 are sourced directly by the DAPS 126 over the data bus 127. When this occurs, the weights 123, 125 from the weight table 203 are not produced. Whether the weights are applied via the weight table 203 or via the data bus 127, the loop phase adjusting circuit 124 serves to provide a phase adjusted local oscillator to the quadrature down-converter 118.

Figure 3:
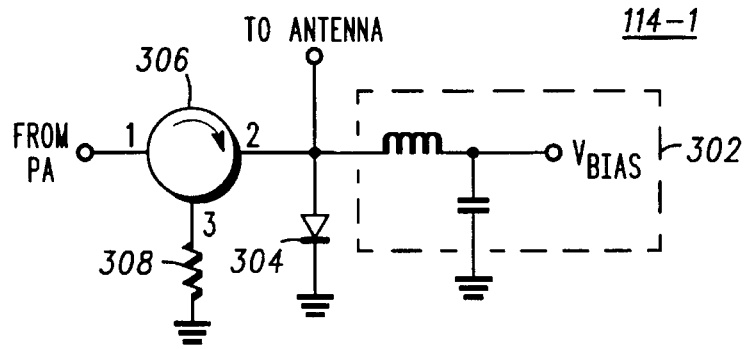
FIG. 3 illustrates a schematic depiction of a transmitter loading circuit in accordance with the present invention.

FIG. 3 shows a first embodiment of the loading circuit 114-1 shown in FIG. 1. In this embodiment, the linear transmitter 100 is put into a non-radiating mode by shunting the output to ground. To accomplish this, a biasing circuit 302 might be employed to forward bias a PIN diode 304, thereby creating a low impedance path to ground. A conventional circulator 306 is used in combination with a resistive element 308 to present a constant load impedance to the output of the power amplifier 110. In this manner, the linear transmitter 100 can be placed in a training mode while maintaining power amplifier stability and without providing undesired interference effects (i.e., splatter) on neighboring channels.

Figure 4:
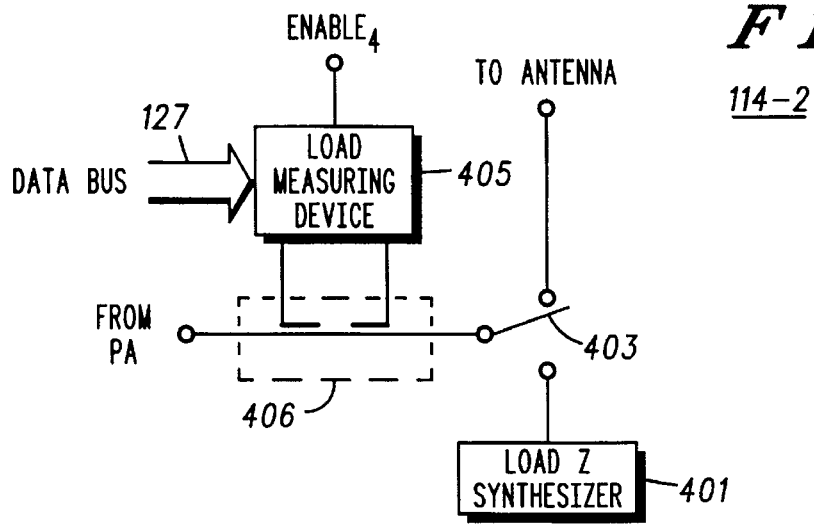
FIG. 4 illustrates a block diagram depiction of an alternate transmitter loading circuit in accordance with the present invention.

FIG. 4 illustrates a second embodiment for the loading circuit 114-2 shown in FIG. 1. In this arrangement, a load impedance synthesizer 401 can be switchably engaged using a switch 403, thereby placing the linear transmitter 100 in a non-radiating mode. Further, when the synthesized load 401 is engaged, a load measuring device 405 can be used in conjunction with a bi-directional coupler 406 to sample the forward signal provided by the output of the power amplifier 110 and a reflected signal produced from reflection of the forward signal from the synthesized load 401. The measured load impedance is then placed onto the databus 127 to update the load impedance information maintained in the DAPS 126. In this manner, variable loads can be placed on the linear transmitter circuit during a training procedure so that appropriate adjustment values can be applied to the adjusting circuits 124, 137, 138 under like loading conditions during normal operation.

Figure 5:
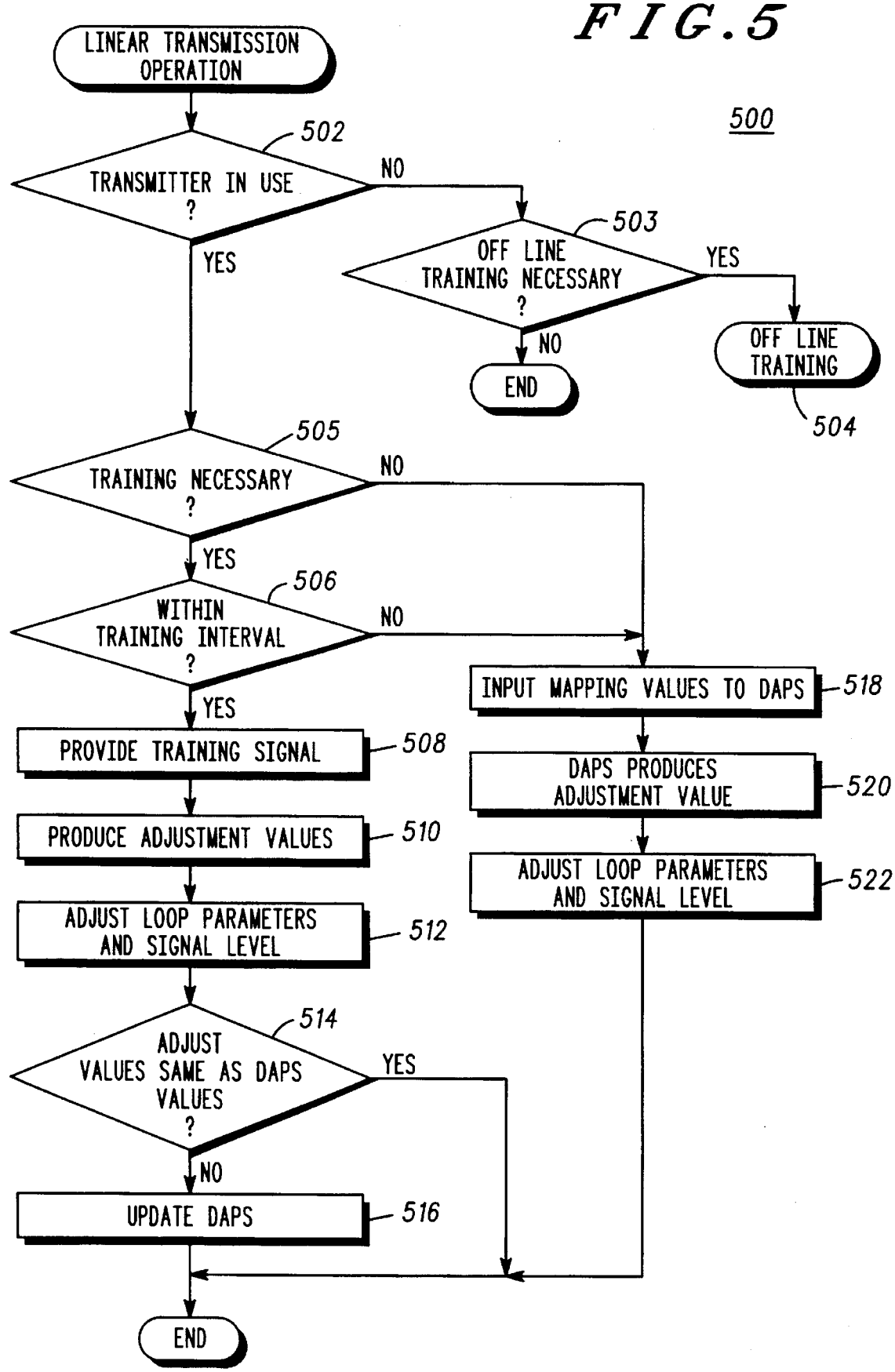
FIGS. 5 and 6 illustrate an exemplary logic flow diagram of steps executed by a linear transmitter in accordance with the present invention.

FIG. 5 shows a flow diagram 500 depicting the operation of the linear transmitter 100, in accordance with the present invention. If it is determined (502) that the transmitter is not currently in use (i.e., not transmitting data), the transmitter determines (503) whether to enter an off-line training procedure (504). If the transmitter is currently in use, a decision is reached to determine (505) whether training is necessary. That is, whether the linear transmitter is operating at an unacceptable level due to the detection of clipping in the output waveform of the transmitter. If training is necessary, a decision is then reached to determine (506) whether the transmission time is within a predetermined training interval—e.g., a portion of a TDMA time slot that has been allocated for training. In a preferred embodiment, the training interval is the first 1 millisecond of a 15 millisecond TDMA time slot.

During—i.e., within—the training interval, a training signal is provided (508) and the appropriate adjustment values are produced (510) at the corresponding phase, gain, and level adjusting circuits 124, 137, 138. That is, the loop parameters (i.e., gain and phase) and signal levels are adjusted (512) using these adjustment values, which are maintained for comparing with the DAPS values. A decision is then reached to determine (514) whether or not the adjustment values are the same (i.e., within a predetermined threshold) of the corresponding values stored in the DAPS 126. If the values are substantially identical, the routine is exited. If one or more of the adjustment values differs from their DAPS counterparts, the DAPS is updated (516) and the routine is exited. The update process, of course, depends on the DAPS embodiment. As an example, for the lookup table, a memory location (corresponding to the current operating parameters—e.g., Fc, Vs) is overwritten. If a system of equations is employed, a more sophisticated method is required that includes modifying the coefficients—e.g., using a least-squares error technique, as later described.

If it is determined that training is not necessary (505), or that the current transmission time is outside the training interval (506), the appropriate mapping values are inputted (518) to the DAPS 126. That is, the current operating frequency (Fc), supply voltage (Vs), temperature (Temp), and/or measured load impedance ($Z_L$) are supplied to the address mapper 128. In this manner, the DAPS 126 is able to identify (520) the appropriate adjustment values for application to the adjusting circuits. As earlier stated, this identification can be made by way of a conventional look up table—i.e., a unique adjustment value corresponding to each combination of operating parameters. Similarly, a system of equations—made up of adjustable coefficients applied to the operating parameter variables—can be used. The identified adjustment values are then placed onto the databus, and used to adjust (522) the loop parameters and signal level by the appropriate adjusting circuits. The routine is then exited, thereby concluding the on-line (i.e., during transmission) update and adjustment processes. In the foregoing manner, the loop parameters and signal level can be adjusted, and updates can be made to the DAPS during the training interval. In addition, the loop parameters and signal level can be adjusted using real time operating parameters when outside the training interval. By utilizing adjustment values stored in the DAPS more frequently than those provided by on-line training, the present invention minimizes interference produced by the training signal used in the on-line training.

Figure 6:
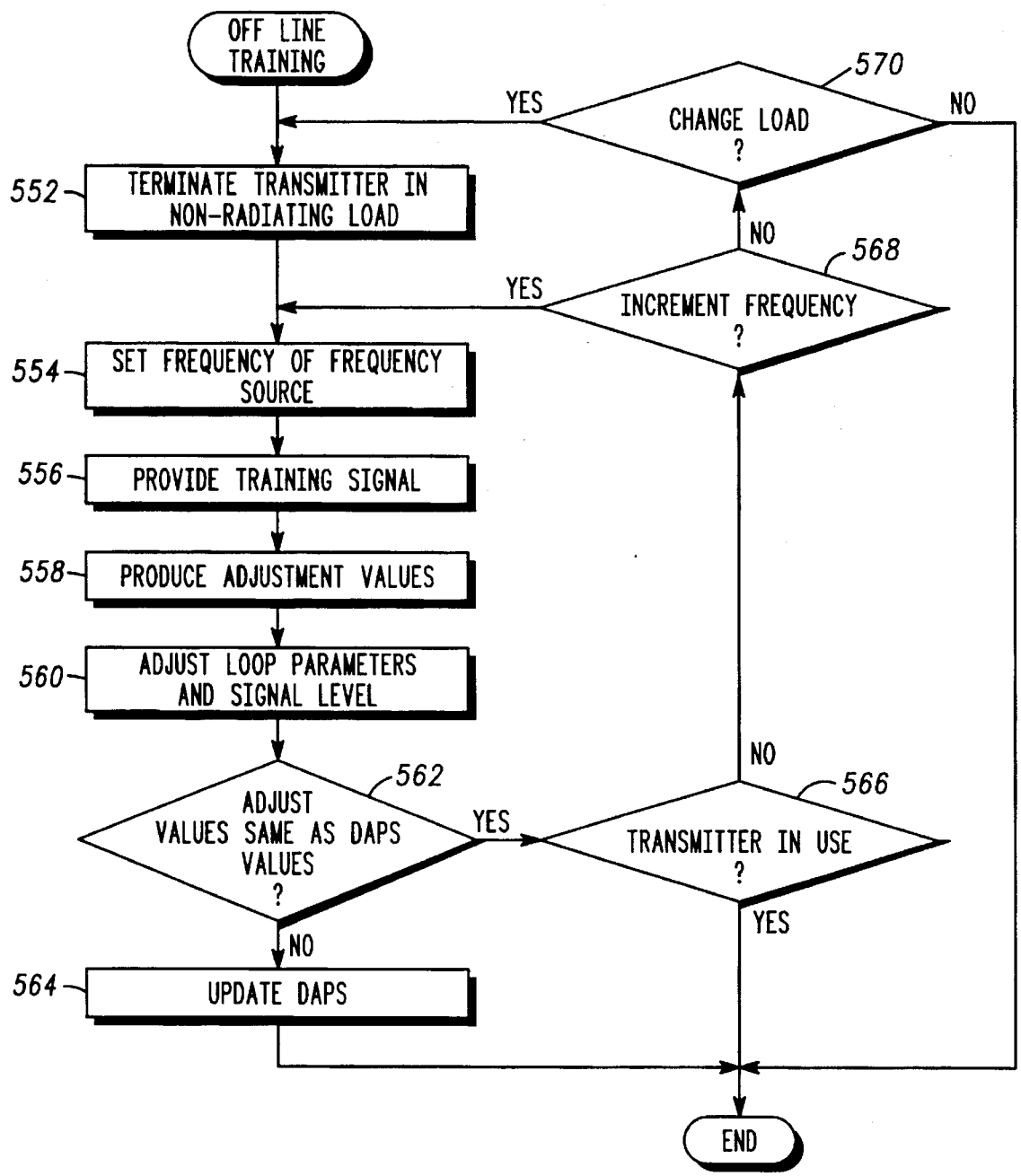

FIG. 6 shows a more detailed flow diagram of the off-line training procedure (504), in accordance with the preferred embodiment of the invention. It should be noted that "off-line" is intended to mean non-radiating. That is, the benefits of training the linear transmitter 100 are realized, without the undesirable interference caused by emitting the training signal energy onto the adjacent channels. The linear transmitter 100 is first terminated (552) in a non-radiating load—e.g., with the arrangement shown in FIG. 4. The operating frequency of the transmitter circuit (i.e., the frequency of the local oscillator in the quad up- and quad down-converters 108, 118 shown in FIG. 1) is set (554) to a first predetermined frequency. The set of frequencies used are chosen to cover the operating range of interest. If the controller 130 and the DAPS 126 provide for data interpolation, the frequency increment may be much coarser (fewer steps) than if each possible operating frequency is included. A training signal is then provided (556) and the adjustment values for the respective adjusting circuits are produced (558). These adjustment values are then used to adjust (560) the loop parameters and signal level, as earlier described. A decision is then reached to determine (562) whether the adjustment values produced match the current values identified in the DAPS. This is done to ensure that accurate adjustment values are maintained in the DAPS. If the values are not substantially identical, the DAPS is updated (564), and the routine is exited.

As earlier mentioned, the update process may include altering locations in a look-up table corresponding to the current operating parameters, or modifying the coefficients in a system of equations. Further discussion of the former embodiment is deemed unnecessary, as such modification requires a simple re-writing of a memory location corresponding to the current operating parameters. For the latter embodiment, an estimate of the required attenuation and phase values can be described mathematically as a function of current operating frequency (F), supply voltage (V), and temperature (T), as follows:

$$\text{Atten/Gain} = K_1 V^2 + K_2 V + K_3 T^2 + K_4 T + K_5 F + K_6; \text{ and}$$

$$\text{Phase} = C_1 V^2 + C_2 V + C_3 T^2 + C_4 T + C_5 F + C_6$$

It should be noted that artisans of ordinary skill would recognize other equations as being equally useful to estimate these values. Further, the above equations could be readily modified to include a load impedance variable ($Z_L$) and accompanying coefficient(s). The coefficients ($C_x$, $K_x$) can be generated/modified using one of several techniques. One technique employs a well-known adaptive weighted recursive least squares (WRLS) error processor. Such a processor uses adjustment values produced during off-line training and the present V, T and F values to calculate the correct coefficients.

If the adjustment values match those found in the DAPS, a decision is reached to determine (566) whether or not the transmitter is currently in use. If there is data to transmit (i.e., no longer off-line), the off-line training routine is exited and the transmitter circuit continues normal operation. If there is still no data to transmit, the frequency is then incremented (568) or the non-radiating load changed (570) so that the adjusting circuits may be re-trained under these new conditions. It should be noted that the training sequence can also be performed under varying supply voltage conditions, thereby making the DAPS even more robust and the transmitter circuit capable of operating properly even when the supply voltage is changing. Similarly, the training procedure can be performed under varying temperature conditions (i.e., by changing the ambient temperature in which the transmitter operates), but doing so would be impractical. Instead, the present invention anticipates a scenario by which a thermistor is included in the transmitter circuit, and a training procedure can be initiated when the thermistor detects a substantial temperature change.

In the foregoing manner, the off-line training procedure can be used to rigorously exercise the linear transmitter circuit 100 over varying operating conditions (Freq, $Z_L$, V, and/or T), and recording the changes made to the required adjustment values. This information can be obtained in a non-interfering manner, since the transmitter is not radiating energy into adjacent channels. This information can then be used during normal operation to account for changing conditions that correspond with those conditions that have been synthesized off-line.

What is claimed is:

1. In a linear transmitter that includes an information signal source and a power amplifier having a varying load impedance, the linear transmitter utilizing a closed loop feedback path to maintain linearity, wherein the closed loop feedback path includes a loop phase adjusting circuit, a method for reducing off-channel interference comprising the steps of:

A) providing a dynamically alterable parameter source;

B) measuring the varying load impedance to produce a measured load impedance;

C) inputting the measured load impedance to the dynamically alterable parameter source;

D) producing, by the dynamically alterable parameter source, a loop phase adjustment value base on the measured load impedance;

E) inputting the loop phase adjustment value to the loop phase adjusting circuit; and F) adjusting, by the loop phase adjusting circuit, a phase value for the closed loop feedback path based, at least in part, on the loop phase adjustment value.

2. In a linear transmitter that includes an information signal source and a power amplifier having a varying load impedance, the linear transmitter utilizing a closed loop feedback path to maintain linearity, and the closed loop feedback path including a loop phase adjusting circuit, a method for reducing off-channel interference comprising the steps of:

A) providing a dynamically alterable parameter source;
B) providing a training signal within a training interval;
C) at times falling substantially within the training interval, measuring the varying load impedance to produce a measured load impedance;
D) inputting the measured load impedance to the dynamically alterable parameter source;

at times falling substantially outside the training interval,

E) using the dynamically alterable parameter source to produce a loop phase adjustment value based on the measured load impedance;
F) inputting the loop phase adjustment value to the loop phase adjusting circuit; and
G) adjusting, by the loop phase adjusting circuit, loop phase of the closed loop feedback path based on the loop phase adjustment value, thereby reducing off-channel interference produced during the training interval and at times falling substantially outside the training interval.

3. The method of claim 2, wherein the closed loop feedback path further includes a loop gain adjusting circuit, the method further comprising the steps of:

at times falling substantially outside the training interval,

H) using the dynamically alterable parameter source to produce a loop gain adjustment value based on the measured load impedance;
I) inputting the loop gain adjustment value to the loop gain adjusting circuit; and
J) adjusting, by the loop gain adjusting circuit, loop gain of the closed loop feedback path based on the loop gain adjustment value, thereby reducing off-channel interference produced during the training interval and at times falling substantially outside the training interval.

4. The method of claim 2, wherein the linear transmitter further includes a signal level adjusting circuit, the method further comprising the steps of:

at times falling substantially outside the training interval,

H) using the dynamically alterable parameter source to produce a signal level adjustment value based on the measured load impedance;
I) inputting the signal level adjustment value to the signal level adjusting circuit; and
J) adjusting, by the signal level adjusting circuit, an amplitude of a signal produced by the information signal source based on the signal level adjustment value, thereby reducing off-channel interference produced during the training interval and at times falling substantially outside the training interval.

5. A linear transmitter that utilizes a closed loop feedback path to maintain linearity, the closed loop feedback path including an amplifier that is terminated with a radiating load element during normal operation, the linear transmitter comprising:

a switch for terminating an output of the amplifier with a non-radiating loading circuit, wherein the non-radiating loading circuit comprises a load impedance synthesizer and a load measuring device; and
means, operably coupled to the non-radiating loading circuit, for adjusting at least one loop parameter of the closed loop feedback path when the output of the amplifier is terminated with the non-radiating loading circuit.

6. A linear transmitter that utilizes a closed loop feedback path to maintain linearity, the closed loop feedback path including an amplifier that is terminated with a radiating load element during normal operation, the linear transmitter comprising:

a PIN diode and a biasing circuit for terminating an output of the amplifier with a non-radiating loading circuit, wherein the non-radiating loading circuit comprises an isolator and a constant loading element; and
means, operably coupled to the non-radiating loading circuit, for adjusting at least one loop parameter of the closed loop feedback path when the output of the amplifier is terminated with the non-radiating loading circuit.

7. In a linear transmitter that includes an information signal source and a power amplifier having a varying load impedance, the linear transmitter utilizing a closed loop feedback path to maintain linearity, and the closed loop feedback path including a loop gain adjusting circuit, a method for reducing off-channel interference comprising the steps of:

A) providing a dynamically alterable parameter source;
B) providing a training signal within a training interval;
C) at times falling substantially within the training interval, measuring the varying load impedance to produce a measured load impedance;
D) inputting the measured load impedance to the dynamically alterable parameter source;

at times falling substantially outside the training interval,

E) using the dynamically alterable parameter source to produce a loop gain adjustment value based on the measured load impedance;
F) inputting the loop gain adjustment value to the loop gain adjusting circuit; and
G) adjusting, by the loop gain adjusting circuit, loop gain of the closed loop feedback path based on the loop gain adjustment value, thereby reducing off-channel interference produced during the training interval and at times falling substantially outside the training interval.

8. In a linear transmitter that includes an information signal source, a power amplifier having a varying load impedance, and a signal level adjusting circuit, the linear transmitter utilizing a closed loop feedback path to maintain linearity, a method for reducing off-channel interference comprising the steps of:

A) providing a dynamically alterable parameter source;
B) providing a training signal within a training interval;
C) at times falling substantially within the training interval, measuring the varying load impedance to produce a measured load impedance;
D) inputting the measured load impedance to the dynamically alterable parameter source;

at times falling substantially outside the training interval,

E) using the dynamically alterable parameter source to produce a signal level adjustment value based on the measured load impedance;
F) inputting the signal level adjustment value to the signal level adjusting circuit; and
G) adjusting, by the signal level adjusting circuit, an amplitude of a signal produced by the information signal source based on the signal level adjustment value, thereby reducing off-channel interference produced during the training interval and at times falling substantially outside the training interval.

* * * * *